(12) United States Patent
Steel

(10) Patent No.: US 10,499,549 B1
(45) Date of Patent: Dec. 3, 2019

(54) RADIO FREQUENCY SHIELDING LOCK BOX

(71) Applicant: Jacob Daniel Steel, Roseville, CA (US)

(72) Inventor: Jacob Daniel Steel, Roseville, CA (US)

( * ) Notice: Subject to any disclaimer, the term of this patent is extended or adjusted under 35 U.S.C. 154(b) by 0 days.

(21) Appl. No.: 16/402,762

(22) Filed: May 3, 2019

(51) Int. Cl.
*H05K 9/00* (2006.01)
*E05G 1/00* (2006.01)
*E05B 19/00* (2006.01)

(52) U.S. Cl.
CPC ....... *H05K 9/0015* (2013.01); *E05B 19/0005* (2013.01); *E05G 1/005* (2013.01); *H05K 9/0009* (2013.01)

(58) Field of Classification Search
CPC .... H05K 9/0015; H05K 9/0009; E05G 1/005; E05B 19/0005
See application file for complete search history.

(56) References Cited

U.S. PATENT DOCUMENTS

| | | | | |
|---|---|---|---|---|
| 4,212,415 A * | 7/1980 | Neely | ..................... | B65D 11/10 220/324 |
| 5,931,514 A * | 8/1999 | Chung | ..................... | F16B 12/26 292/89 |
| 7,553,180 B2 * | 6/2009 | Hu | .......................... | E05C 19/06 220/284 |
| 8,245,868 B2 * | 8/2012 | Ikeda | ................... | F02M 35/024 206/1.5 |
| 2002/0079244 A1 * | 6/2002 | Kwong | .................... | A45C 3/00 206/305 |
| 2007/0093090 A1 * | 4/2007 | Fujimaki | .............. | H01H 50/043 439/76.2 |
| 2009/0146862 A1 * | 6/2009 | Malone | ................ | H05K 9/0045 342/1 |
| 2011/0014863 A1 * | 1/2011 | Foster | .................... | H04K 3/415 455/1 |

* cited by examiner

*Primary Examiner* — Abhishek M Rathod
(74) *Attorney, Agent, or Firm* — John P. Costello; Costello Law Corp.

(57) ABSTRACT

An electronic shielding device used to secure articles like keys and key fobs from radiating signals is disclosed. The electronic shielding device includes a housing having a lid member and a storage member, a locking unit for securing articles utilizing a locking mechanism and a plurality of attachment means connecting the lid member to the storage member. The locking unit is keyed or coded to a customer's own specific key/lock. The electronic shielding device is designed to attach to an object such as but not limited to a vehicle, a door and a window.

6 Claims, 4 Drawing Sheets

RADIO FREQUENCY SHIELDING LOCK BOX

CROSS-REFERENCE TO RELATED APPLICATIONS

Not Applicable.

BACKGROUND OF THE DISCLOSURE

Technical Field of the Disclosure

The present disclosure relates generally to shielding devices, and more particularly to a radio frequency shielding lock box for securing electronic devices.

Description of the Related Art

Electronic devices include electrical systems that are sensitive to radio frequency interference (RFI) as well as electromagnetic interference (EMI) of several megahertz. Several approaches have been made to protect electronic components from external electric fields. A wide variety of radio frequency (RF) shielding boxes are available in the art. The RF shielding boxes restrict RF waves from nearby RF devices, emitting RF waves or electromagnetic (EM) waves.

In several existing methods, the RF shielding boxes allow RF signals to escape from within the electronic device housing depending on the material of the housing. Plastic shielded box housings offer no protection from RF or EM waves unless they are shielded with a highly conductive coating and are properly grounded. In order to overcome this issue, the plastic shielding box is being improved by coating with steel. Steel housings at very high frequencies offer some protection from magnetically generated interference but lose a major degree of RF protection due to poor electrical conductivity.

In order to overcome the issue with steel housings, aluminum enclosures have been developed. Shielding boxes with aluminum provide good protection from RF signals and very high frequency EM signals due to their high degree of electrical conductivity. But when the EM signals are within low frequency ranges the aluminum shielding box provides very little protection. To overcome this low protection, EM/RF bags and pouches have been developed in which the bag or pouch is sealed around the electronic component and then placed in a cushioned box for essential physical protection. But when the RF/EM bag is opened, each time it must be replaced or resealed in order to maintain RF/EM protection.

Yet another shielding box includes a cardboard container positioned on its interior walls with anti-static plastic members. These anti-static plastic members are slotted with ribs for receiving the static sensitive devices. The disadvantage of such devices is that they are not electrically conductive and are merely anti-static.

There is thus a need for a shielding box that would shield RF and EM signals from entering into the shielded box thereby securing the components secured inside the box. Also, there is a need for a shielding box that would prevent the escape of RF and EM signals emanating from a source placed inside of the box. Such a needed device would provide an enclosure that would not have the unfavorable qualities of boxes made of aluminum, steel, or plastic. Further, such a needed device would be portable and cost effective. The present invention overcomes the prior art shortcomings and accomplishes these and other critical objectives.

SUMMARY OF THE INVENTION

To minimize the limitations found in the prior art, and to minimize other limitations that will be apparent upon the reading of the specification, the present invention provides a method for shielding radio frequency and electromagnetic signals from entering into the electronic shielding device thereby securing the components placed inside the electronic shielding device. The electronic shielding device also shields radio frequency and electromagnetic signals from escaping the electronic shielding device. The electronic shielding device includes a housing having a lid member and a storage member, a locking unit is designed to secure at least one article inside the storage member utilizing a locking mechanism and a plurality of attachment means for connecting the lid member with the storage member.

In a preferred embodiment of the invention, the lid member is detachably attached to the storage member utilizing the plurality of attachment means. When the lid member is closed upon the storage member, a locking unit is engaged to keep the device closed and secured. The locking unit is positioned separate from the housing and in the preferred embodiment, is positioned on top of the housing to prevent the possibility of EM or RF signals leaking from inside the unit to outside the unit through the locking unit. The locking unit is keyed or coded to a customer's own specific key/lock in this first embodiment.

In the preferred embodiment, the storage member is sealed with a compressible foam rubber gasket to obstruct radiating signals. Parker Chomerics, of Woburn, Mass. is a source for gaskets having RF shielding attributes. The electronic shielding device forms a Faraday cage and provides physical security and electronic security by blocking the radiating signals from entering or escaping the device. The inventive device is preferably made from a composite material which helps aid in the Faraday cage qualities of the inventive device. Parker Chomerics, of Woburn, Mass. provides a composite material made of carbon fiber, carbon powder and stainless steel, which can be formed into a housing for shielding EM and RF waves from entering or leaving the device.

A first objective of the invention is to obstruct the radiating signal thereby securing the articles present inside the electronic shielding device.

A second objective of the invention is to provide a physical security by providing a locking unit. The locking unit is keyed and coded to a customer's own specific key/lock.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood by those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized, and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

As used herein, the singular forms "a", "an" and "the" include plural referents unless the context clearly dictates otherwise. "And" as used herein is interchangeably used with "or" unless expressly stated otherwise. As used herein, the term 'about" means+/–5% of the recited parameter. All embodiments of any aspect of the invention can be used in combination, unless the context clearly dictates otherwise.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "wherein", "whereas", "above," and "below" and words of similar import, when used in this application, shall refer to this application as a whole and not to any particular portions of the application.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize.

Figure 1:
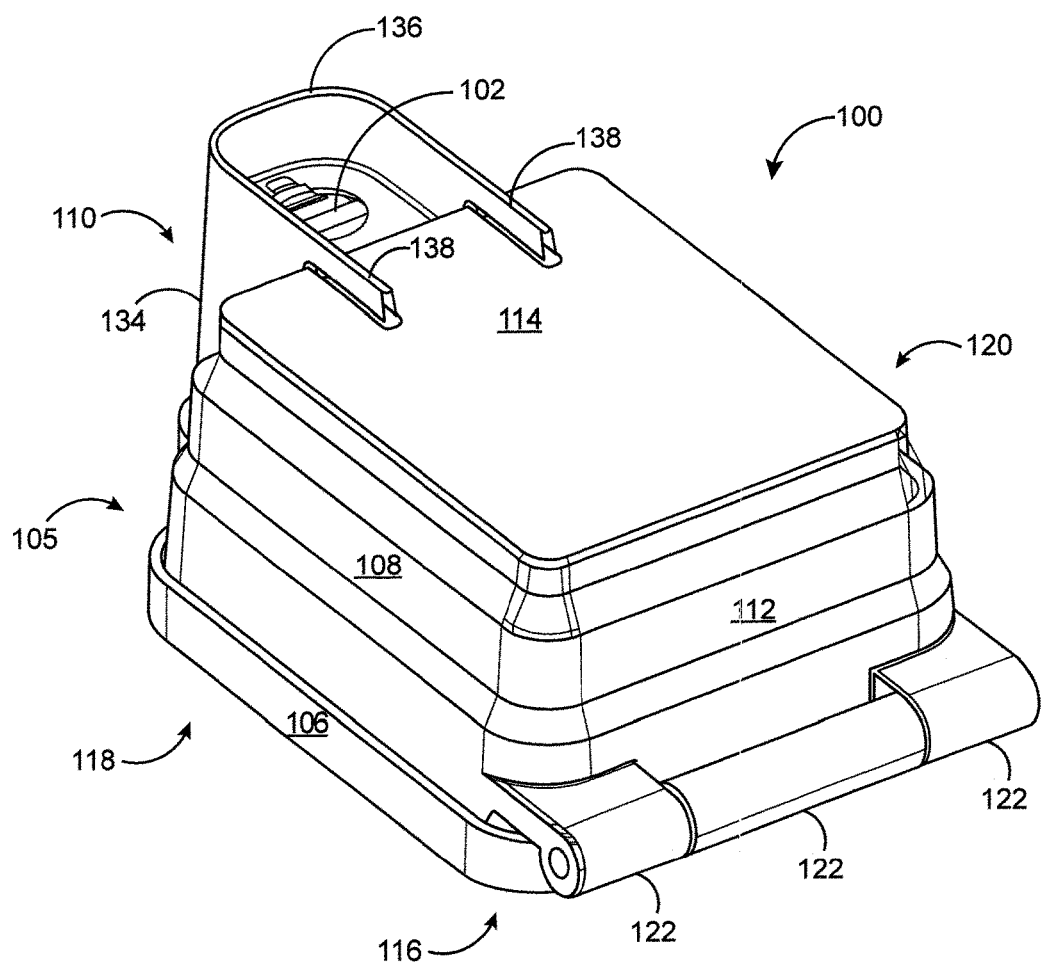
FIG. 1 is a perspective view of a preferred embodiment of the electronic shielding device.

FIG. 1 illustrates a perspective view of an electronic shielding device 100 that is the invention. The electronic shielding device 100 is designed to attach to a vehicle, a door, a window and an object utilizing a fastening means. The electronic shielding device 100 is used to secure key and key fobs from radiating signals outward, through the device, so that EM or RF signals cannot be read by an unauthorized party. Unfortunately, a common tactic of car thieves is to employ an RF reader to read the coded signals emanating from a key fob residing in a lock box attached to a car in a car lot. The thief merely has to record the signal and then manufacture a bootleg key fob and come back to steal the car.

The electronic shielding device 100 includes a housing 105 having a lid member 106 and a storage member 108, and a locking unit 102. This embodiment has positioned the locking unit 102 away from the housing 105 the locking unit 102 preferably being positioned above the lid member 106 and storage member 108. That is the locking unit is positioned externally elevated above the housing perimeter. The elevated positioning of locking unit 102 further reduces the possibility that RF or EM waves will leave or enter the device 100 through gaps in the locking unit 102. For example, an electronic key fob fully enclosed in the housing 105 of this device 100 would not be prone to leaking any RF signals through the locking unit 102, as the locking unit 102 is positioned above the housing 105 itself.

Figure 2:
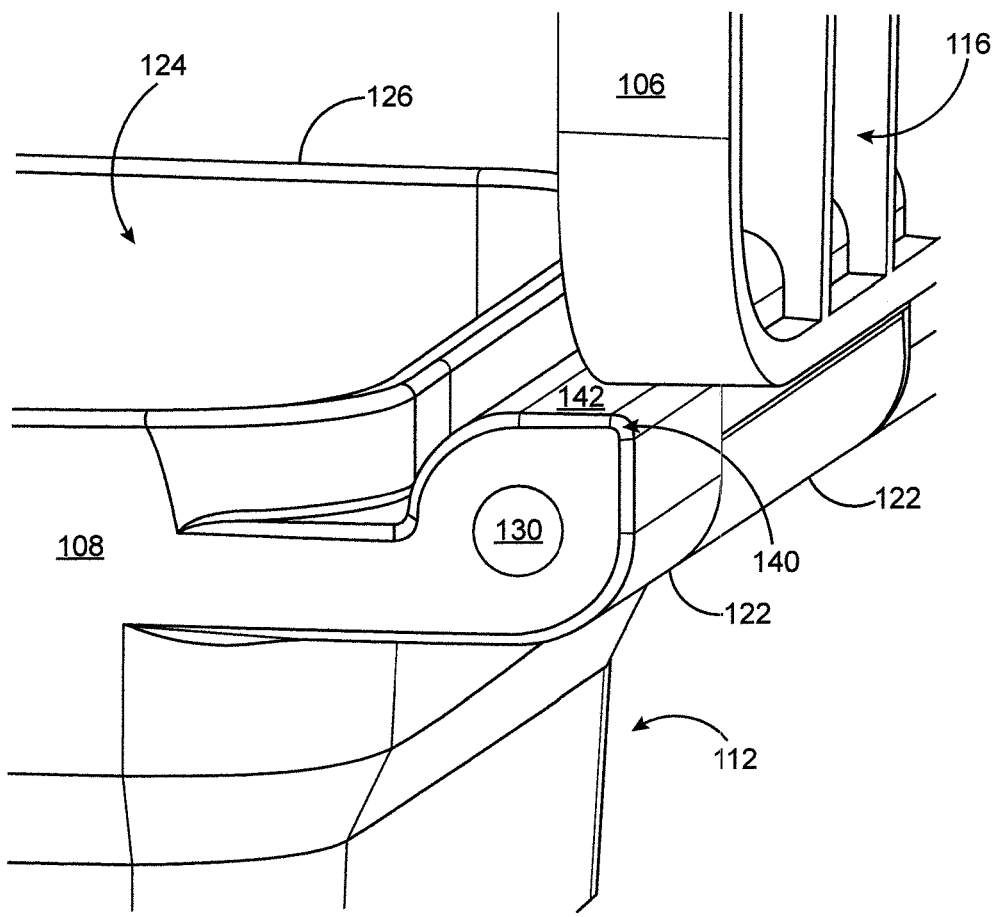
FIG. 2 is a closeup view of preferred hinge members from the inventive electronic shielding device, the hinge members having a corner and flattened top to allow for the lid member to remaining at a ninety-degree orientation relative to the storage member when the lid member is at maximum articulation relative to storage member.

The electronic shielding device 100, as represented by this preferred embodiment, has a top end 110, a bottom end 112, top surface 114, a bottom surface 116, a left side 118 and a right side 120. A plurality of hinge members 122 connected by a steel hinge rod 130 couple the lid member 106 to the storage member 108 in an articulating manner. FIG. 2 shows a closeup of hinge members 122 connected by steel hinge rod 130, hinge members 122 having a corner 140 and flattened top 142 to allow for lid member 106 to remaining at a ninety-degree orientation relative to storage member 108 when lid member 106 is at maximum articulation relative to storage member 108.

Figure 3:
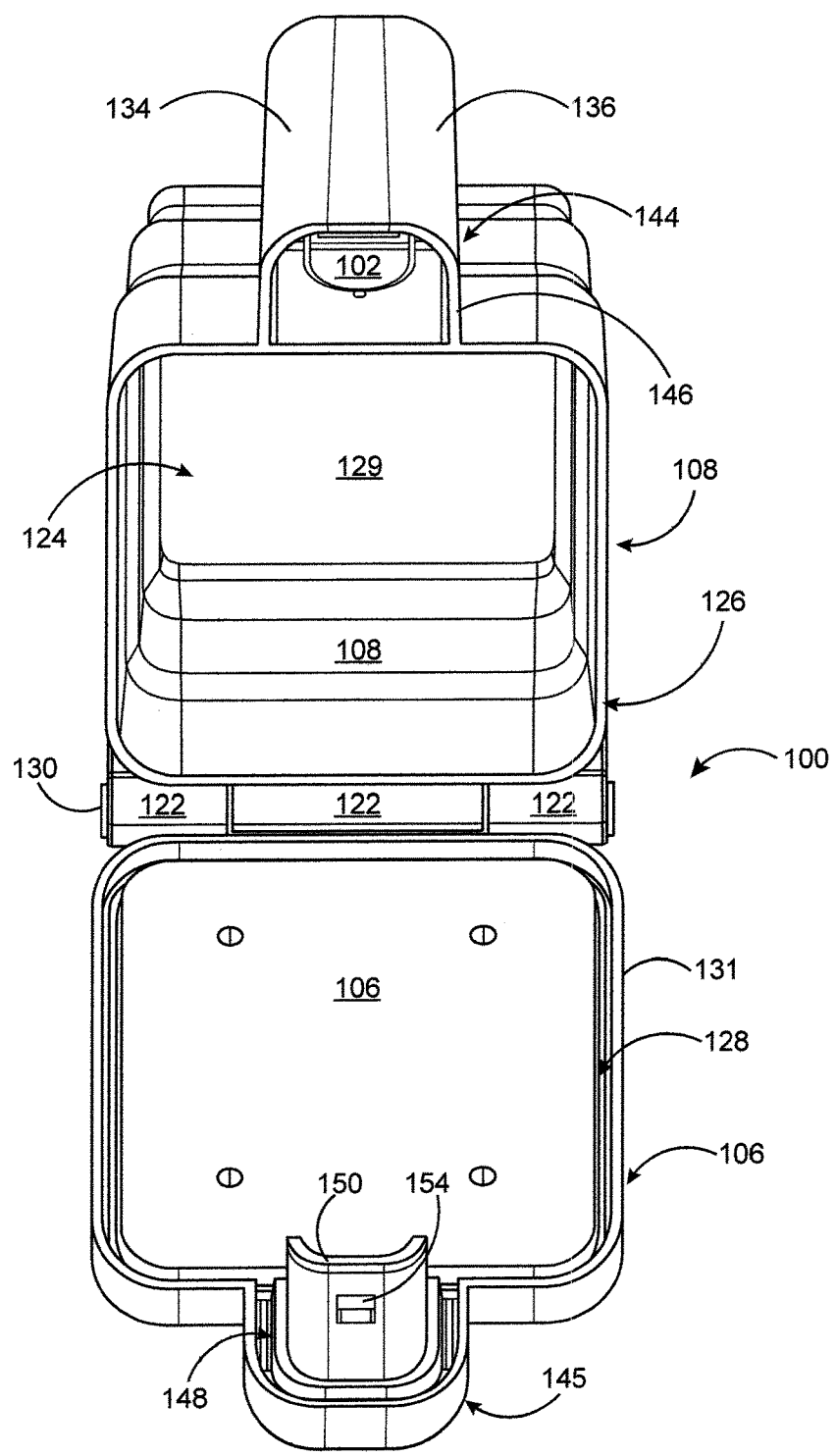
FIG. 3 is an interior plan view of the preferred embodiment introduced in FIG. 7, shown in an open position with the lid member opened and articulated in a maximum arc away from the storage member so as to make visible the major inner components of the device.

FIG. 3 is an interior plan view of the preferred embodiment shown in an open position with the lid member 106 opened and articulated in a maximum arc away from the storage member 108 so as to make visible the major inner components. The interior of storage member 108 is comprised of a cavity 124 bordered by a surrounding perimeter edge 126 which engages with a perimeter groove 128 of the lid member 106. Groove 128 is preferably occupied by a foam rubber gasket (not shown) which compresses when contacted by surrounding perimeter edge 126, sealing off any leakage of RF or EM signals from within the device. The interior side 129 of top surface 114 forms the bottom of cavity 124. Lid member 106 has a perimeter edge 131 which overlaps the perimeter edge 126 of the storage member 108 when the device 100 is fully closed.

Figure 4:
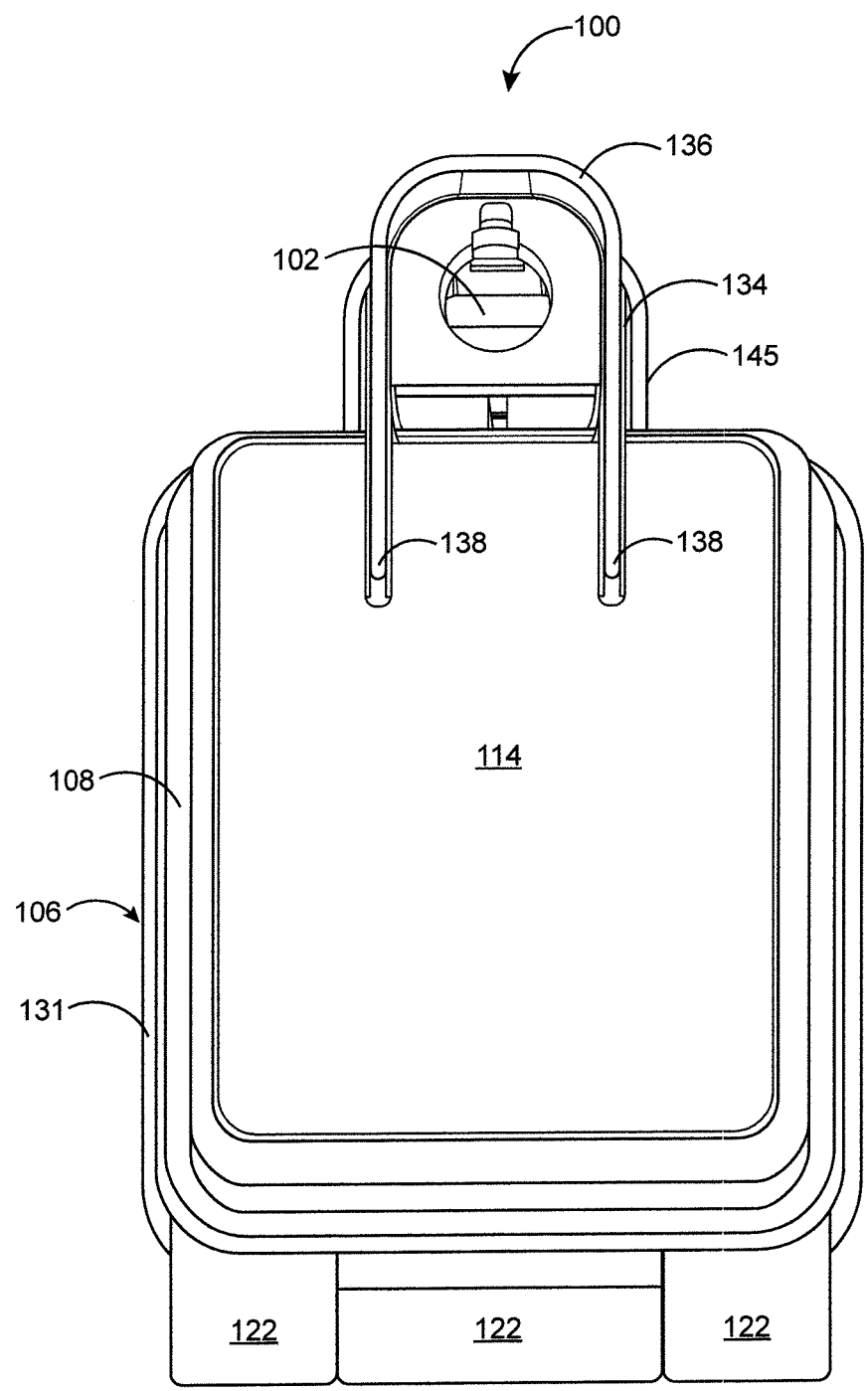
FIG. 4 is a front perspective view of the preferred embodiment of the electronic shielding device showing reinforcing ribs joining with the shroud which surrounds the recessed locking unit.

Locking unit 102 is elevated above lid member 106 and storage member 108, residing in a locking unit housing 134 attached to the top end 110 of device 100. Locking unit housing 134 extends from near the bottom surface 116, forward, toward the top surface 114 of the device to provide a reinforced shroud 136 around the locking unit 102, giving the locking unit a recessed positioning within locking unit housing 134. Shroud 136 is joined to the top surface 114 of storage member 108 by reinforcing ribs 138. Shroud 136 helps prevent breaching of the locking unit 102 through blunt-force methods such as sledge hammers and the like. Locking unit housing 134 extends rearward from the shroud 136 and provides further protection to any internal lock mechanisms (not shown). FIG. 4 is a front perspective view of the device 100 showing the reinforcing ribs 138 joining with the shroud 136 and the recessed locking unit 102. This view shows how locking unit housing 134 engages with latch base member 145 in an overlapping manner.

Referring again to FIG. 3 terminus 144 of locking unit housing 134 resides at the end opposite shroud 136, wherein the terminus 144 is comprised of perimeter edge 146. Perimeter edge 146 engages within a perimeter groove 148 of latch base member 145. Latch base member 145 overlaps locking unit housing 134, slightly, when lid member 106 is closed fully upon storage member 108. The latch base member 145 has a latch plate tower 150 protruding substantially perpendicular relative to the latch base member 145, the latch plate tower 150 advancing inside of locking unit housing 134 to engage with the striker (not shown) of locking unit 102. Striker of locking unit 102 engages with latch window 154 of latch plate tower 150. The device 100 is preferably locked by closing storage member 108 upon lid member 106, the striker engaging latch plate window 154. Opening the device 100 involves inserting a key into locking unit 102 to disengage the striker from latch plate window.

The foregoing description of the embodiments of the present invention has been presented for the purpose of illustration and description. It is not intended to be exhaustive or to limit the invention to the precise form disclosed, Many modifications and variations are possible in light of the above teachings. It is intended that the scope of the present invention not be limited by this detailed description, but by the claims and the equivalents to the claims appended hereto.

What is claimed is:

1. An electronic shielding device comprising:
   a housing having a lid member and a storage member, the lid member coupled to the storage member in an articulating manner;
   the housing further comprising a top end, a bottom end, a top surface, a bottom surface, a left side and a right side;
   a locking unit for securing at least one article within the housing, the locking unit utilizing a locking mechanism, the locking unit positioned external to a perimeter of the housing;
   whereby the electronic shielding device prevents the entry and exit of at least one radiating signal to and from the housing thereby securing at least one article placed inside the housing; and
   wherein the locking unit is positioned on a top end of the housing, the locking unit residing in a locking unit housing wherein the locking unit housing further comprises a shroud, the shroud placing the locking unit in a recessed position, the shroud joining to the housing by reinforcing ribs attach to a top surface of the storage member.

2. The electronic shielding device of claim 1, further comprising a latch base member, the latch base member attaching to a top end of the lid member, wherein a perimeter groove of the latch base member receives a perimeter edge of the locking unit housing in an overlapping manner, the latch base member connecting to a latch plate tower, the latch plate tower protruding substantially perpendicular relative to the latch base member, the latch plate tower being configured to advance inside of the locking unit housing to engage with a striker of the locking unit, the striker further engaging with a latch window of the latch plate tower.

3. The electronic shielding device of claim 1 is designed to attach to a vehicle, a door, a window and an object.

4. The electronic shielding device of claim 3, wherein the lid member further comprises a perimeter groove for receiving a perimeter edge of the storage member, the perimeter groove of the lid member further comprising a compressible gasket.

5. The electronic shielding device of claim 4, wherein the compressible gasket is an RF shielding gasket.

6. An electronic shielding device comprising:
   a housing having a lid member and a storage member, the lid member coupled to the storage member in an articulating manner;
   the housing further comprising a top end, a bottom end, a top surface, a bottom surface, a left side and a right side;
   a locking unit for securing at least one article within the housing, the locking unit utilizing a locking mechanism, the locking unit being positioned on a top end of the housing, the locking unit residing in a locking unit housing wherein the locking unit housing further comprises a shroud, the shroud placing the locking unit in a recessed position within the shroud, the shroud further being joined to a top surface of the storage member by reinforcing ribs;
   a latch base member, the latch base member attaching to a top end of the lid member, wherein a perimeter groove of the latch base member receives a perimeter edge of the locking unit housing in an overlapping manner, the latch base member connecting to a latch plate tower, the latch plate tower protruding substantially perpendicular relative to the latch base member, the latch plate tower being configured to advance inside of the locking unit housing to engage with a striker of the locking unit, the striker further engaging with a latch window of the latch plate tower; and
   whereby the electronic shielding device prevents the entry and exit of at least one radiating signal to and from the housing thereby securing at least one article placed inside the housing.

* * * * *